United States Patent
Pandita et al.

(10) Patent No.: US 10,476,434 B1
(45) Date of Patent: Nov. 12, 2019

(54) QUADRATURE CLOCK GENERATION WITH INJECTION LOCKING

(71) Applicant: QUALCOMM Incorporated, San Diego, CA (US)

(72) Inventors: Bupesh Pandita, Raleigh, NC (US); Zhuo Gao, Austin, TX (US); Eskinder Hailu, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 41 days.

(21) Appl. No.: 15/990,311

(22) Filed: May 25, 2018

(51) Int. Cl.
| | |
|---|---|
| H03B 5/00 | (2006.01) |
| H03B 5/06 | (2006.01) |
| H03K 3/03 | (2006.01) |
| H04L 7/06 | (2006.01) |
| H04L 27/16 | (2006.01) |
| H03L 7/18 | (2006.01) |

(52) U.S. Cl.
CPC .............. *H03B 5/06* (2013.01); *H03K 3/0315* (2013.01); *H03L 7/18* (2013.01); *H04L 7/06* (2013.01); *H04L 27/16* (2013.01)

(58) Field of Classification Search
CPC ........................................................ H03B 5/06
USPC .......................................................... 331/16
See application file for complete search history.

(56) References Cited

U.S. PATENT DOCUMENTS

| | | | | |
|---|---|---|---|---|
| 5,748,144 | A * | 5/1998 | Rodal | G01S 19/235 342/357.4 |
| 9,444,435 | B1 * | 9/2016 | Monaco | H03K 3/0322 |
| 9,444,438 | B2 * | 9/2016 | Depaoli | H03K 5/00006 |
| 2016/0365994 | A1 | 12/2016 | Chen et al. | |
| 2017/0288853 | A1 | 10/2017 | Oster et al. | |
| 2018/0013435 | A1 | 1/2018 | Namkoong et al. | |

OTHER PUBLICATIONS

Bashir I., et al., "A Digitally Controlled Injection-Locked Oscillator with Fine Frequency Resolution," IEEE Journal of Solid-State Circuits, Jun. 2016, vol. 51, No. 6, pp. 1347-1360.

Raj M., et al., "A Wideband Injection Locked Quadrature Clock Generation and Distribution Technique for an Energy-Proportional 16-32 Gb/s Optical Receiver in 28 nm FDSOI CMOS," IEEE Journal of Solid-State Circuits, Oct. 2016, vol. 51, No. 10, pp. 2446-2462.

* cited by examiner

*Primary Examiner* — Joseph Chang
(74) *Attorney, Agent, or Firm* — Loza & Loza, LLP/Qualcomm

(57) ABSTRACT

Aspects of the disclosure are directed to quadrature clock generation with injection locking. In accordance with one aspect, quadrature clock generation with injection locking uses a digital calibration circuit having a coarse calibration circuit and a fine calibration circuit to perform a coarse frequency calibration of a controlled oscillator, wherein the controlled oscillator is coupled to the digital calibration circuit; characterize a replica oscillator signal path associated with an oscillator replica circuit, wherein the oscillator replica circuit is coupled to the controlled oscillator; perform a fine frequency calibration of the controlled oscillator by measuring a phase difference between the controlled oscillator and the oscillator replica circuit; and generate a calibrated set of quadrature clock signals after performing the fine frequency calibration of the controlled oscillator.

30 Claims, 11 Drawing Sheets

QUADRATURE CLOCK GENERATION WITH INJECTION LOCKING

TECHNICAL FIELD

This disclosure relates generally to the field of digital clocks, and, in particular, to quadrature clock generation with injection locking.

BACKGROUND

Digital clock signals are part of the fundamental infrastructure of an integrated circuit, for example, to coordinate logic state transitions in a synchronous digital circuit. A digital clock signal may be generated by a clock generator such as a ring oscillator or an injection-locked clock oscillator, for example. However, a free-running ring oscillator or an injection-locked clock oscillator may have undesired frequency drift due to process, voltage and temperature (PVT) variations in the integrated circuit. Thus, improved clock generation using an injection-locked clock oscillator which minimizes clock frequency drift is desired.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides for quadrature clock generation with injection locking using a digital calibration circuit with a coarse calibration circuit and a fine calibration circuit. Accordingly, a method for quadrature clock generation with injection locking using a digital calibration circuit having a coarse calibration circuit and a fine calibration circuit including performing a coarse frequency calibration of a controlled oscillator, wherein the controlled oscillator is coupled to the digital calibration circuit; characterizing a replica oscillator signal path associated with an oscillator replica circuit, wherein the oscillator replica circuit is coupled to the controlled oscillator; performing a fine frequency calibration of the controlled oscillator by measuring a phase difference between the controlled oscillator and the oscillator replica circuit; and generating a calibrated set of quadrature clock signals after performing the fine frequency calibration of the controlled oscillator.

In one example, the method further includes generating a coarse calibration signal. In one example, the coarse calibration signal is generated by a coarse calibration circuit. In one example, the coarse calibration circuit is a component of the digital calibration circuit. In one example, the coarse calibration circuit includes a coarse digital to analog converter (DAC), and wherein the coarse digital to analog converter (DAC) generates the coarse calibration signal. In one example, the coarse calibration signal is generated in an open loop mode. In one example, the coarse calibration signal is generated without an injection signal present in the controlled oscillator.

The method may further include using the coarse frequency calibration to drive a frequency of the controlled oscillator towards a target frequency. In one example, the characterizing the replica oscillator signal path is performed without an injection signal present in the controlled oscillator. In one example, the characterizing the replica oscillator signal path is performed using a variable time delay. In one example, the variable time delay is controlled by a feedback signal. In one example, the feedback signal is an average of a phase difference between a first clock signal and a second clock signal.

In one example, the first clock signal is an output of the controlled oscillator and the second clock signal is an output of the oscillator replica circuit. In one example, the controlled oscillator includes a plurality of cascaded stages with a final stage. In one example, the oscillator replica circuit is matched to the final stage. In one example, the fine frequency calibration is performed in a closed loop.

In one example, the method further includes using a phase difference between a first clock signal and a second clock signal as a feedback signal to achieve the closed loop. In one example, the first clock signal is an output of the controlled oscillator and the second clock signal is an output of the oscillator replica circuit. In one example, the fine frequency calibration is performed with an injection signal present in the controlled oscillator. In one example, the calibrated set of quadrature clock signals includes an inphase clock signal and a quadrature clock signal. In one example, the calibrated set of quadrature clock signals are calibrated for one of the following: a) a frequency offset, b) a frequency drift, or c) a frequency offset and a frequency drift. In one example, the phase difference is based on one or more of the following: a) the frequency offset, b) the frequency drift, or c) the frequency offset and the frequency drift.

Another aspect of the disclosure provides an injection-locked clock generator including a controlled oscillator (CO) to generate a clock signal; an oscillator replica circuit coupled to the controlled oscillator, the oscillator replica circuit to generate a replica clock signal; and a digital calibration circuit coupled to the controlled oscillator, wherein the digital calibration circuit includes a coarse calibration circuit and a fine calibration circuit, and wherein the fine calibration circuit performs a fine frequency calibration based on a phase difference between the clock signal and the replica clock signal. In one example, the injection-locked clock generator further includes a phase detector for generating the phase difference. In one example, the controlled oscillator includes a plurality of cascaded stages with a final stage. In one example, the injection-locked clock generator further includes a pulse generator to provide an injected clock signal to the final stage. In one example, the controlled oscillator generates a calibrated set of quadrature clock signals after the fine calibration circuit performs the fine frequency calibration. In one example, the coarse calibration circuit generates a coarse calibration signal. And, in one example, the coarse calibration circuit includes a coarse digital to analog converter (DAC), and wherein the coarse digital to analog converter (DAC) generates the coarse calibration signal.

Another aspect of the disclosure provides an apparatus for quadrature clock generation with injection locking, the apparatus including means for performing a coarse frequency calibration of a controlled oscillator, wherein the controlled oscillator is coupled to the digital calibration circuit; means for characterizing a replica oscillator signal path associated with an oscillator replica circuit, wherein the oscillator replica circuit is coupled to the controlled oscillator; means for performing a fine frequency calibration of the controlled oscillator by measuring a phase difference between the controlled oscillator and the oscillator replica circuit; and means for generating a calibrated set of quadrature clock signals after performing the fine frequency calibration of the controlled oscillator.

Another aspect of the disclosure provides a computer-readable medium storing computer executable code, operable on a device including at least one processor and at least one memory coupled to the at least one processor, wherein the at least one processor is configured to implement quadrature clock generation with injection locking, the computer executable code including instructions for causing a computer to perform a coarse frequency calibration of a controlled oscillator, wherein the controlled oscillator is coupled to the digital calibration circuit; instructions for causing the computer to characterize a replica oscillator signal path associated with an oscillator replica circuit, wherein the oscillator replica circuit is coupled to the controlled oscillator; instructions for causing the computer to perform a fine frequency calibration of the controlled oscillator by measuring a phase difference between the controlled oscillator and the oscillator replica circuit; and instructions for causing the computer to generate a calibrated set of quadrature clock signals after performing the fine frequency calibration of the controlled oscillator. In one example, the computer-readable medium further includes instructions for causing the computer to perform the fine frequency calibration with an injection signal present in the controlled oscillator.

These and other aspects of the invention will become more fully understood upon a review of the detailed description, which follows. Other aspects, features, and implementations of the present invention will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 1:
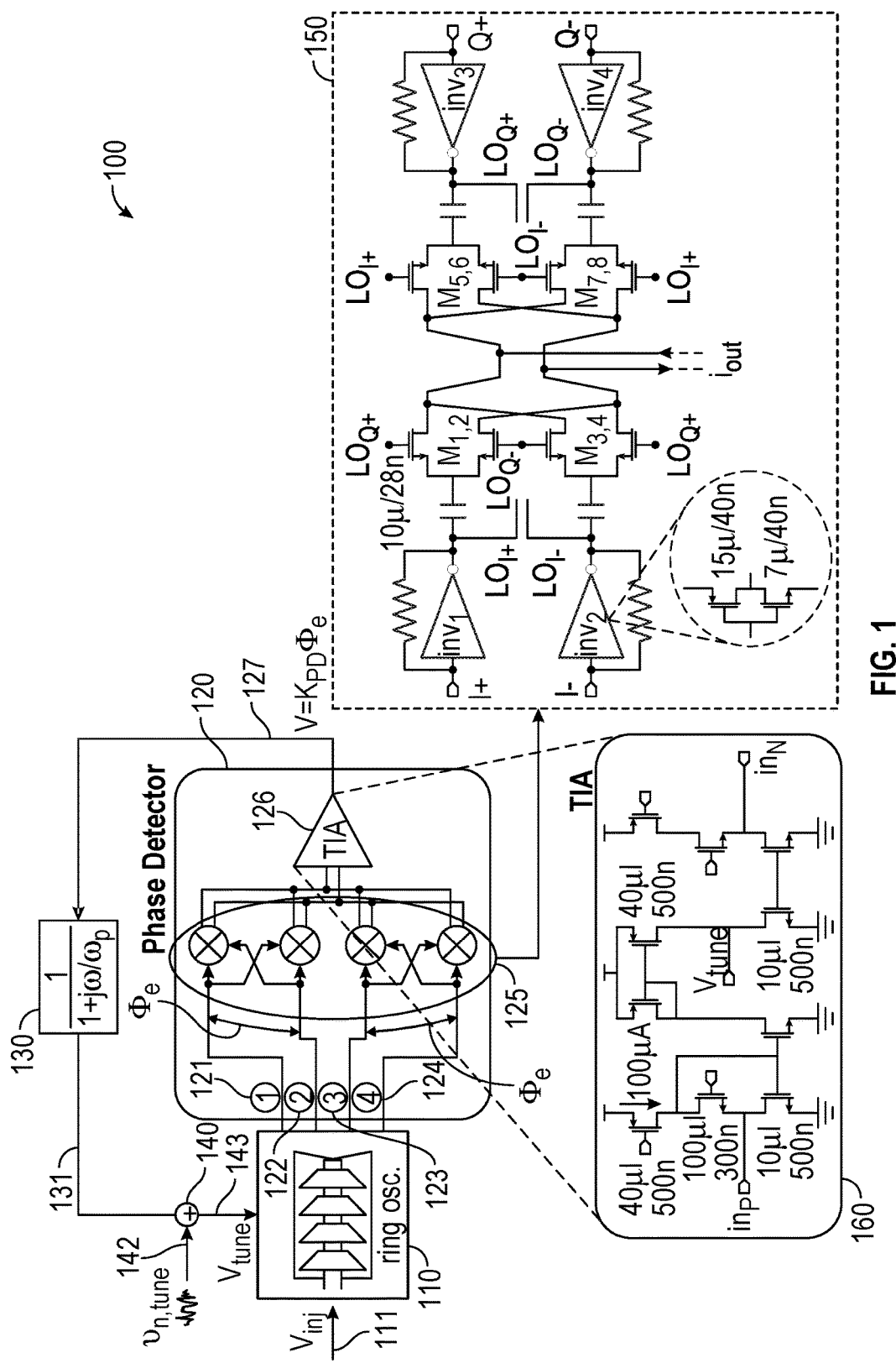
FIG. 1 illustrates a first example of a clock generator with an analog calibration loop.

FIG. 1 illustrates a first example of a clock generator 100 with an analog calibration loop. As shown in FIG. 1, the clock generator 100 includes a ring oscillator 110. The ring oscillator 110, for example, includes four stages, and receives an injection signal 111 (labeled as Vinj) to initiate an oscillation. One skilled in the art would understand that although four stages are shown in the example of FIG. 1, other quantities of stages may be included.

In one example, the ring oscillator 110 produces four output signals, a first output waveform 121, a second output waveform 122, a third output waveform 123 and a fourth output waveform 124. For example, the four output signals may be derived from a common waveform with different phase offsets. The four output signals 121, 122, 123, 124 are sent to a phase detector 120. In one example, the phase detector 120 includes two sets of cross-coupled mixers 125 which feed a transimpedance amplifier (TIA) 126. In one example, the TIA 126 provides a phase detector output V 127 which is proportional to a phase error $\phi_e$ (i.e., $V=K_{PD}*\phi_e$). In one example, the phase error $\phi_e$ is defined as a first phase difference between the first output waveform 121 and the second output waveform 122 or a second phase difference between the third output waveform 123 and the fourth output waveform 124.

In one example, the phase detector output V 127 is sent to a feedback filter 130. For example, the feedback filter 130 has a transfer function (i.e., frequency domain output/input ratio) $H(\omega)$ of the form: $H(\omega)=1/(1+j\omega/\omega_p)$, where $\omega$=angular frequency in rad/s, $\omega_p$=filter cutoff angular frequency in rad/s, j=imaginary unit=$\sqrt{-1}$. In one example, the feedback filter transfer function represents a low pass filter with cutoff angular frequency $\omega_p$ (i.e., signals with angular frequency $\omega<\omega_p$ are transferred by the low pass filter, whereas signals with angular frequency $\omega>\omega_p$ are attenuated by the low pass filter). In one example, the feedback filter 130 is an analog circuit. The feedback filter 130 produces a feedback filter output 131.

In one example, a feedback filter output 131 may be a first input to a summer 140 and a noise source may be a second input 142 to the summer 140. For example, a summer output 143 may be provided as a tuning input $V_{tune}$ to the ring oscillator 110. In one example, the tuning input $V_{tune}$ may be used to adjust a free running frequency of the ring oscillator 110 depending on the phase detector output V 127. For example, the tuning input $V_{tune}$ depends on the feedback filter output 131. In one example, the feedback filter output 131 is part of an analog calibration loop.

In one example, the two sets of cross-coupled mixers 125 may be implemented by a first detailed circuit diagram 150 which includes a plurality of inverters and transistors. In one example, the TIA 126 may be implemented by a second detailed circuit diagram 160 which includes a plurality of transistors.

Figure 2:
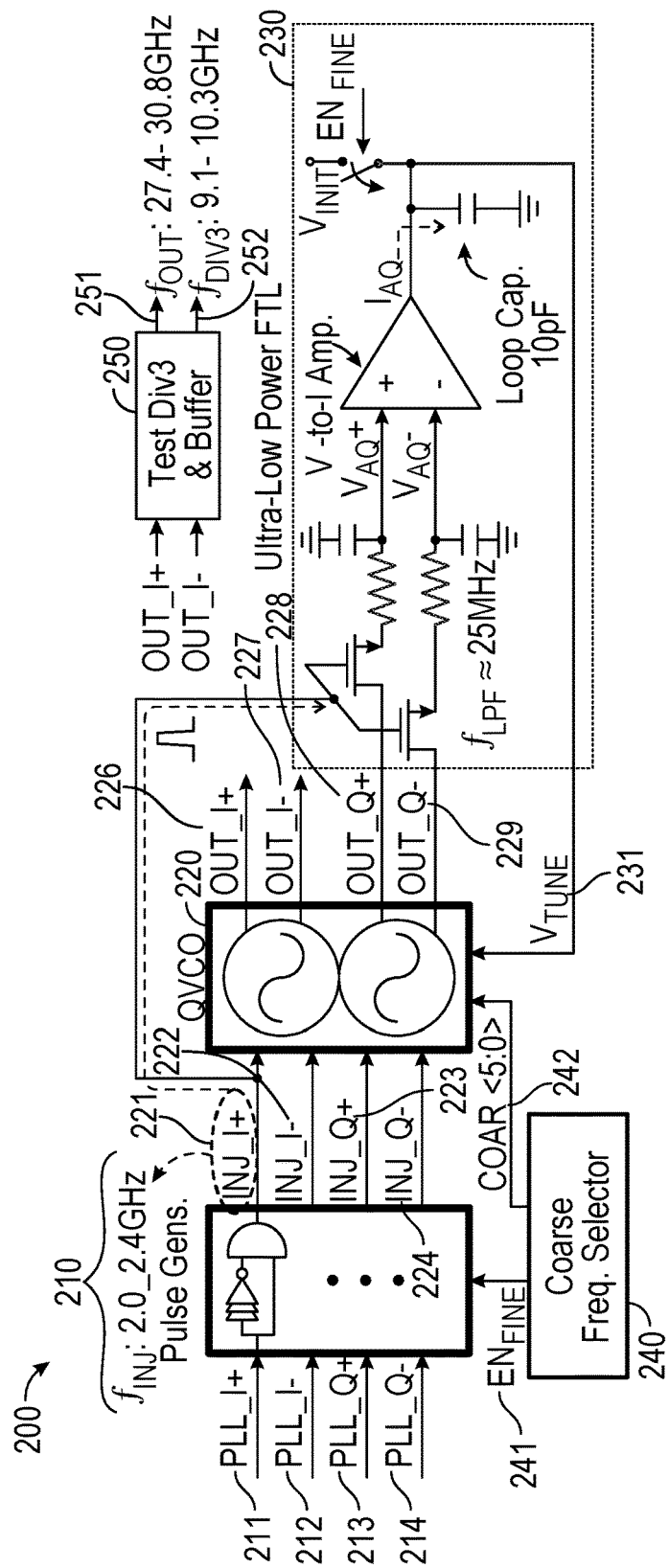
FIG. 2 illustrates a second example of a clock generator with an analog calibration loop.

FIG. 2 illustrates a second example of a clock generator 200 with an analog calibration loop. In one example, the clock generator 200 includes a pulse generator 210. In one example, the pulse generator generates a plurality of pulse outputs each with an injection frequency ($f_{INJ}$) in the range of 2.0 to 2.4 GHz. One skilled in the art would understand that other injection frequency ranges may be used. The pulse generator 210 is provided with four inputs: a plus inphase input 211 (labeled as PLL_I+), a minus inphase input 212 (labeled as PLL_I−), a plus quadrature input 213 (labeled as PLL_Q+) and a minus quadrature input 214 (labeled as PLL_Q−) In one example, the pulse generator 210 supplies four pulse outputs: a plus injected inphase signal 221 (labeled as INJ_I+), a minus injected inphase signal 222 (labeled as INJ_I−), a plus injected quadrature signal 223 (labeled as INJ_Q+) and a minus injected quadrature signal 224 (labeled as INJ_Q−). One skilled in the art would understand that although four inputs and four pulse outputs are shown for the pulse generator 210, other quantities of inputs and/or pulse outputs may be accommodated. For example, the four pulse outputs 221-224 may be sent as inputs to a quadrature voltage-controlled oscillator (QVCO) 220.

In one example, the QVCO 220 may produce four output waveforms: a plus inphase output waveform 226 (labeled as OUT_I+), a minus inphase output waveform 227 (labeled as OUT_I−), a plus quadrature output waveform 228 (labeled as OUT_Q+) and a minus quadrature output waveform 229 (labeled as OUT_Q−). For example, the plus quadrature output waveform 228 (labeled as OUT_Q+) and the minus quadrature output waveform 229 (labeled as OUT_Q−) may serve as two signal inputs to a frequency tracking loop (FTL) 230. In one example, the frequency tracking loop (FTL) 230 is an ultra-low power FTL as labeled in FIG. 2. In one example, the FTL 230 includes a low pass filter ($f_{LPF}$), a voltage to current amplifier (V-to-I Amp) and a loop capacitor (Loop Cap). In one example, the low pass filter ($f_{LPF}$) has s cutoff frequency of at approximately 25 MHz and the loop capacitor (Loop Cap) has a capacitance of 10 pF. One skilled in the art would understand that the cutoff frequency of the low pass filter ($f_{LPF}$) and the capacitance of the loop capacitor (Loop Cap) may vary according to many factors, such as but not limited to design choice, application, user choice, etc. The FTL 230 may also provide a tuning voltage output $V_{tune}$ 231 to the QVCO 220. In one example, the FTL 230 is an analog calibration loop for the QVCO 220.

In one example, the plus inphase output waveform OUT_I+ 226 and the minus inphase output waveform OUT_I− 227 are sent as inputs to a divider/buffer circuit 250. For example, the divider/buffer circuit produces a buffered output ($f_{OUT}$) 251 and a divided output ($f_{DIV3}$) 252. In one example, the buffered output ($f_{OUT}$) 251 may have a buffered frequency range of 27.4-30.8 GHz and the divided output ($f_{DIV3}$) 252 may have a divided frequency range of 9.1-10.3 GHz.

In one example, the clock generator 200 includes a coarse frequency selector circuit 240. The coarse frequency selector circuit 240 may provide an enable signal $EN_{FINE}$ 241 to the pulse generator 210 and a coarse calibration signal (COAR) 242 to the QVCO 220. In one example, the coarse calibration signal (COAR) has six bits <5:0>.

Figure 3:
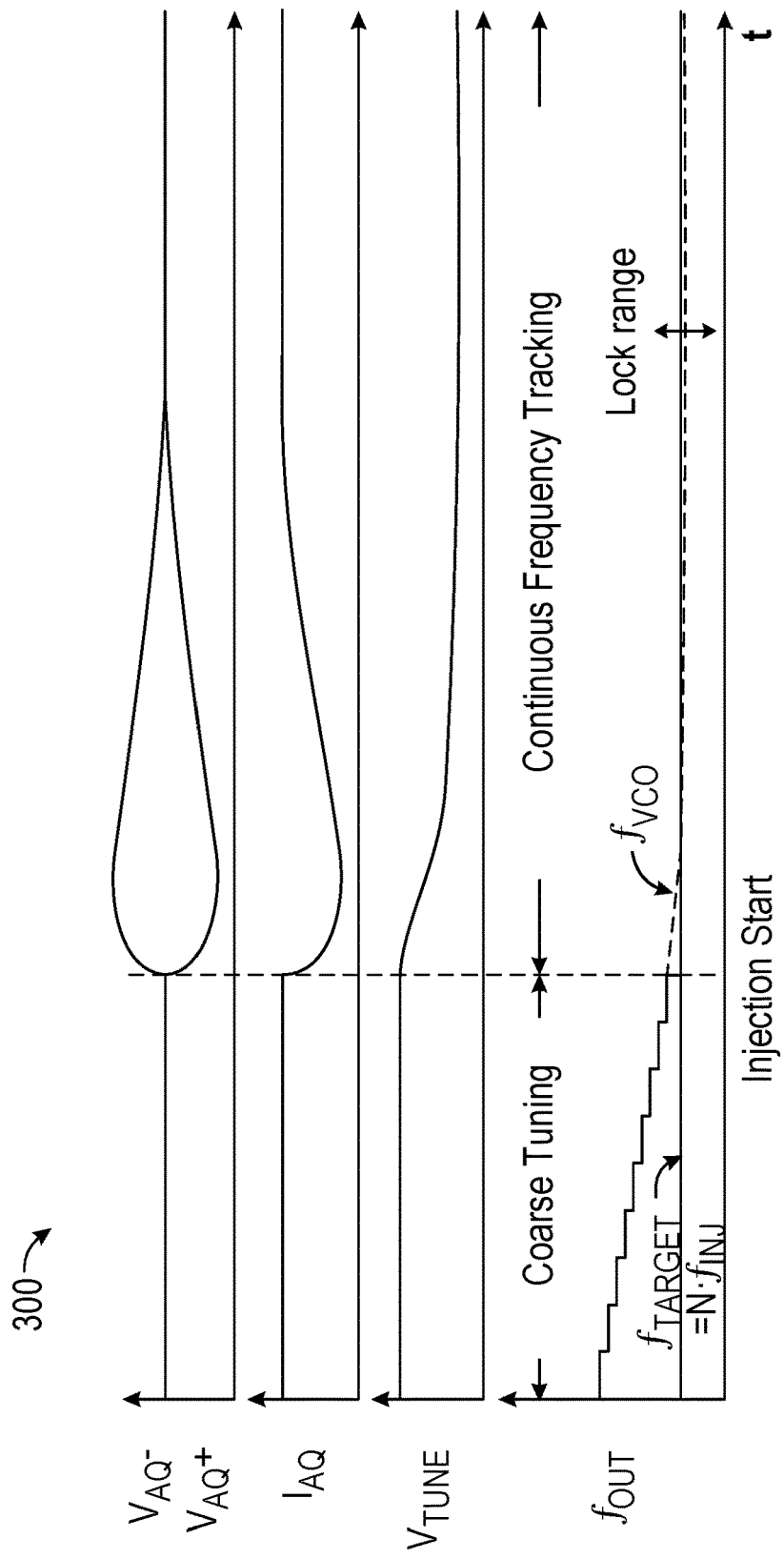
FIG. 3 illustrates an example chart showing signal waveforms for the second example clock generator with an analog calibration loop illustrated in FIG. 2.

FIG. 3 illustrates an example chart 300 showing signal waveforms for the second example clock generator 200 with an analog calibration loop illustrated in FIG. 2. In one example, the clock generator transitions from a coarse tuning mode to a continuous frequency tracking mode as shown in FIG. 3. The horizontal axis of chart 300 is in the unit of time (t). The vertical axes of chart 300 include $V_{AQ}-$, $V_{AQ}+$, $I_{AQ}$, tuning voltage output $V_{tune}$ 231, and buffered output ($f_{OUT}$) 251. In one example, $V_{AQ}-$ and $V_{AQ}+$ are input differential voltages of a voltage to current amplifier. In one example, $I_{AQ}$ is the output current of the voltage to current amplifier.

Figure 4:
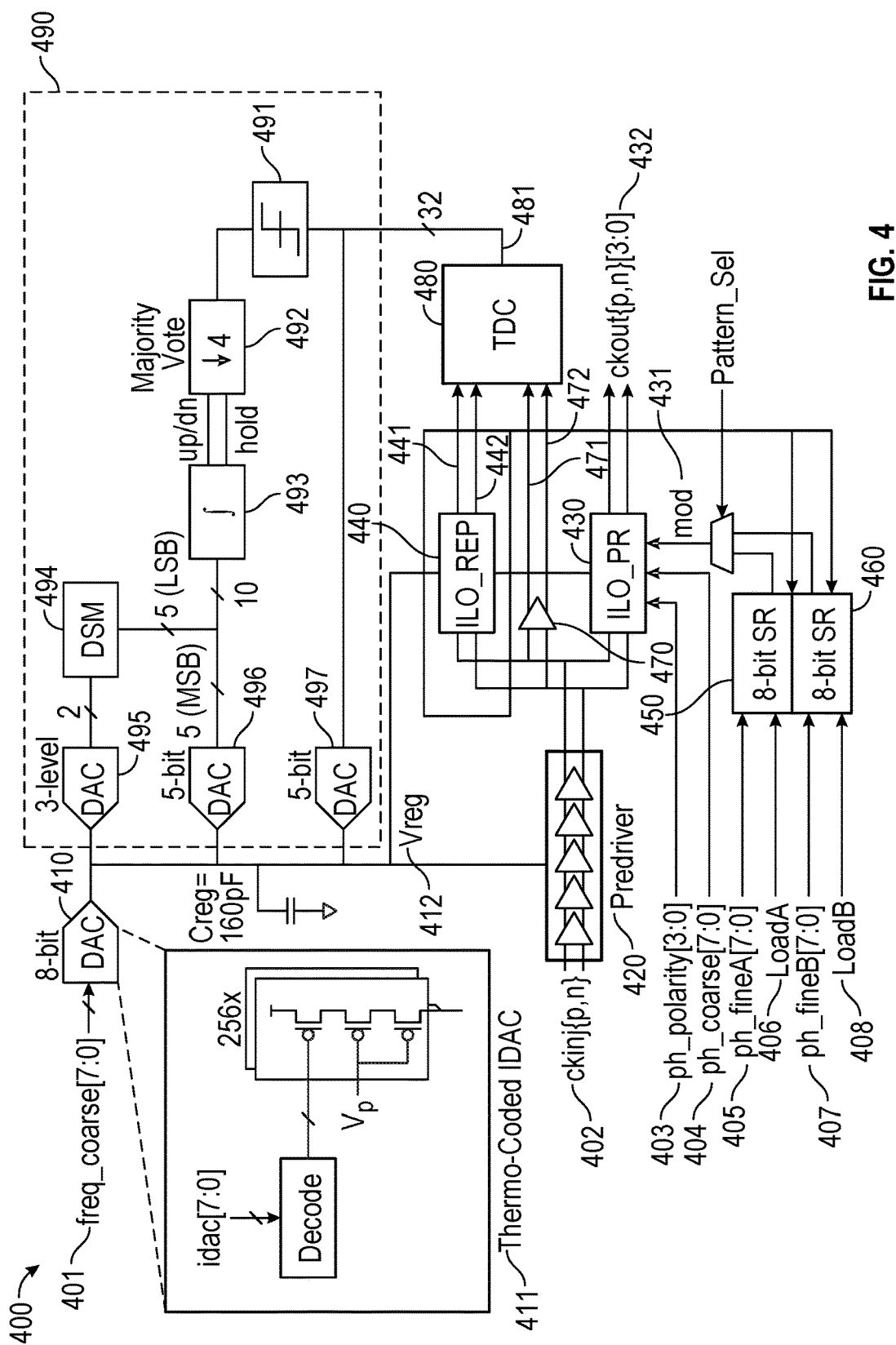
FIG. 4 illustrates a third example of a clock generator with an analog calibration loop.

FIG. 4 illustrates a third example of a clock generator 400 with an analog calibration loop. In one example, the clock generator 400 includes a replica oscillator for free-running frequency tracking. In one example, the clock generator 400 includes a coarse frequency input 401 which is coupled to a first digital to analog converter (DAC) 410. In one example, the first DAC 410 is a thermo-coded current DAC 411. The clock generator 400 may also include an injected clock signal 402 which is coupled to a predriver 420. The predriver 420 is controlled by a regulator signal Vreg 412. The predriver 420 is coupled at its output to a controlled oscillator 430 (e.g. ILO_PR) and to a replica oscillator 440 (e.g. ILO_REP).

In one example, the controlled oscillator 430 may be controlled by a phase polarity signal 403 (labeled as ph_polarity) and a coarse phase signal 404 (labeled as ph_coarse). In addition, the controlled oscillator 430 is modulated by a modulation signal 431 derived from a first phase signal 405 (labeled as ph_fineA) sent to a first shift register 450 (e.g. loaded by a first load signal 406 (labeled as loadA)) and a second phase signal 407 (labeled as ph_fineB) sent to a second shift register 460 (e.g. loaded by a second load signal 408 (labeled as loadB)). In one example, the controlled oscillator 430 has a clock output signal 432 (labeled as ckout).

In one example, a time to digital converter (TDC) 480 accepts outputs 441, 442 from the replica oscillator 440 and buffered outputs 471, 472 from a buffer amplifier 470. For example, the buffer amplifier is coupled to the predriver 420. The TDC 480 has an output 481 which is fed back to the regulator signal Vreg 412 through a feedback circuit 490 which contains several components (e.g., comparator 491, decimator 492, accumulator 493, delta sigma modulator (DSM) 494, digital to analog converters (DACs) 495, 496, 497).

Figure 5:
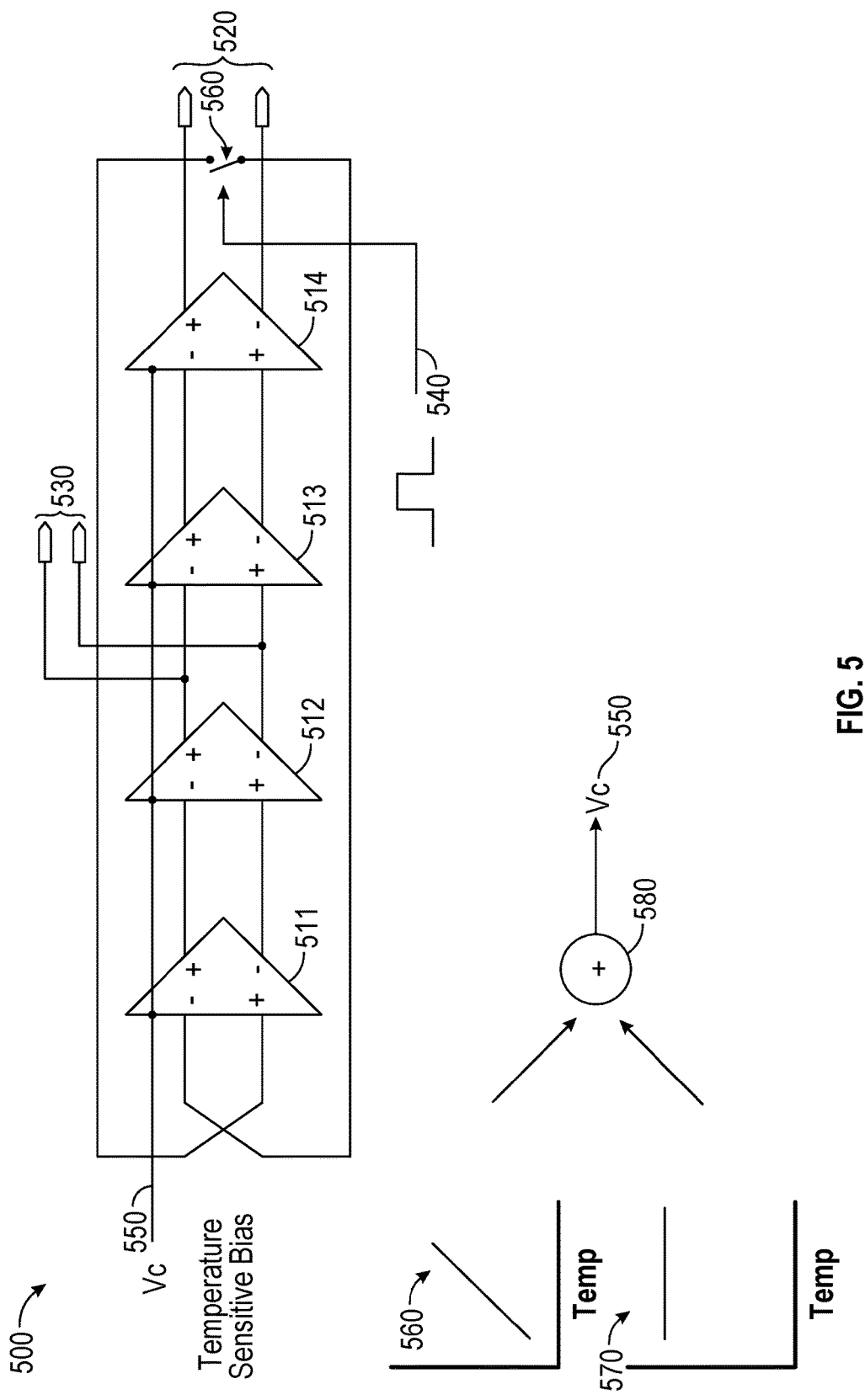
FIG. 5 illustrates an example of an injection oscillator.

FIG. 5 illustrates an example of an injection oscillator 500. In one example, the injection oscillator 500 may be used with a clock generator, such as but not limited to, the example clock generators shown herein. In one example, the injection oscillator 500 includes a temperature sensitive voltage bias to provide a bias voltage dependent on temperature.

In one example, the injection oscillator 500 includes a first inverter 511, a second inverter 512, a third inverter 513 and a fourth inverter 514. An inphase waveform output 520 may be generated by the fourth inverter 514 and a quadrature waveform output 530 may be generated by the second inverter 512. In addition, an injection pulse 540 may be injected into switch 560. In one example, the injection pulse 540 may be used to synchronize the injection oscillator 500 when the switch 560 is placed in a closed state. In addition, a temperature sensitive bias signal 550 (labeled as Vc) may be applied to the inverters 511, 512, 513, 514 to compensate for temperature sensitivity of the injection oscillator 500. In one example, a first bias component 560 and a second bias component 570 are added together in a summer 580 to produce the temperature sensitive bias signal 550 (labeled as Vc).

Figure 6:
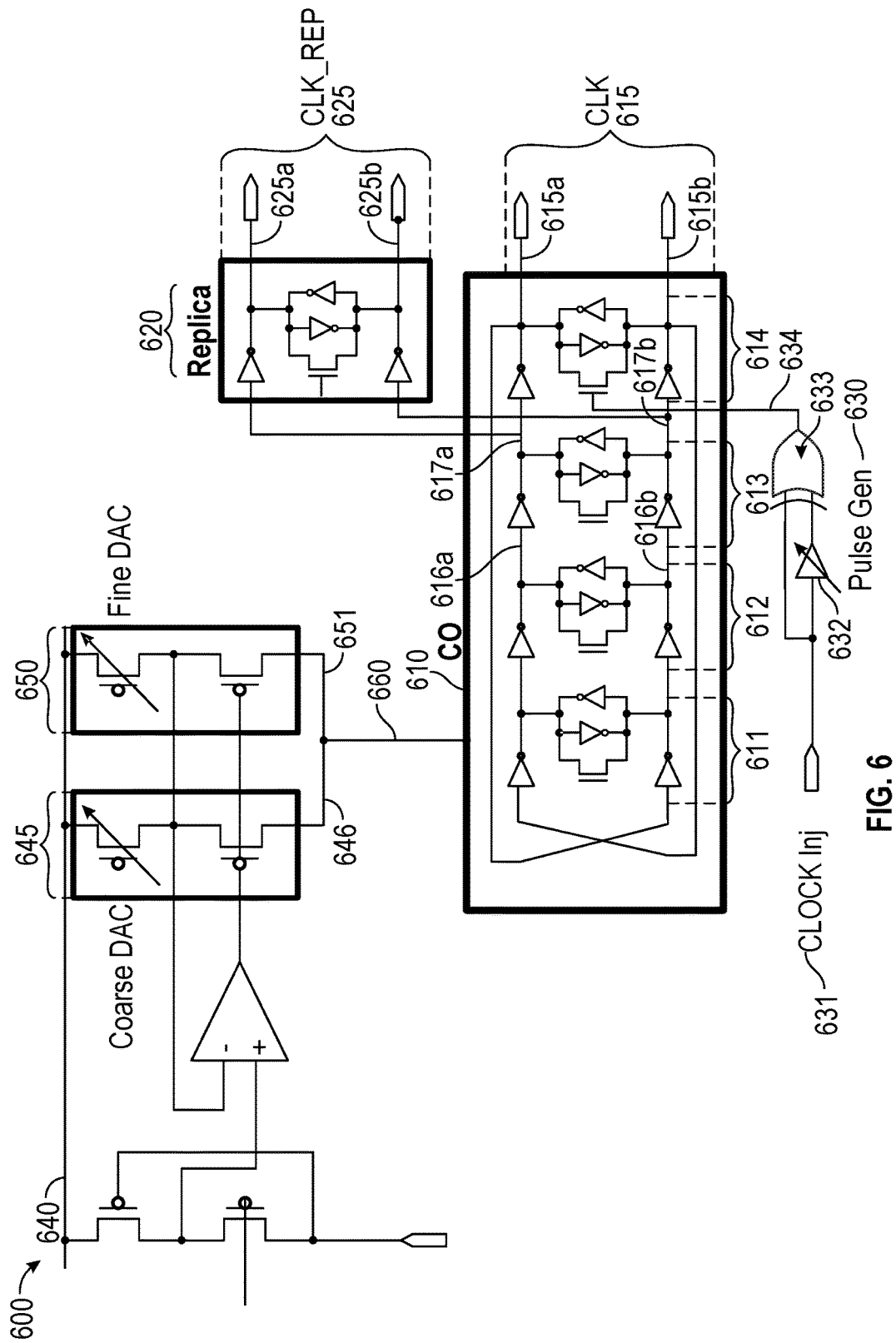
FIG. 6 illustrates an example of an injection-locked clock generator with digital calibration.

FIG. 6 illustrates an example of an injection-locked clock generator 600 with digital calibration. In one example, the injection-locked generator 600 includes a controlled oscillator (CO) 610, an oscillator replica circuit 620, a pulse generator 630, and a digital calibration circuit 640 which includes a coarse calibration circuit 645 and a fine calibration circuit 650.

In one example, the controlled oscillator (CO) 610 is a current controlled oscillator (CCO). In another example, the controlled oscillator (CO) 610 is a voltage-controlled oscillator (VCO). In one example, the controlled oscillator (CO) 610 includes multiple stages and generates an inphase clock output signal 615 (labeled as CLK). In one example, the CO 610 may include four cascaded stages: a first stage 611, a second stage 612, a third stage 613 and a fourth stage 614. In the example of FIG. 6, the fourth state 614 is the final stage. One skilled in the art would understand that although four stages are shown in the example of FIG. 6, that other quantity of stages may be used and are within the scope and spirit of the present disclosure.

The CO 610 may include an oscillator replica circuit 620 with one stage to generate a replica clock signal 625 (labeled as CLK_REP). For example, the inphase clock output signal 615 (labeled as CLK) may include a plus inphase output 615a and a minus inphase output 615b. For example, the replica clock signal 625 (labeled as CLK_REP) may include a plus replica output 625a and a minus replica output 625b.

In one example, the oscillator replica circuit 620 is closely matched in terms of circuit construction to the final stage of the CO 610. In addition, an injected clock signal 631 (labeled as CLOCK_Inj) may be inserted into the fourth stage 614 (i.e., the final stage) of the CO 610 to shift a phase of clock signal 615 (labeled as CLK) relative to a phase of the replica clock signal 625 (labeled as CLK_REP). In one example, a phase difference PHI is defined as a difference between the phase of clock signal 615 (labeled as CLK) and the phase of replica clock signal 625 (labeled as CLK_REP). In one example, the phase difference PHI may indicate a phase error between a free running CO clock signal and the injected clock signal 631 (labeled as CLOCK_Inj). In one example, the phase difference PHI may be perturbed by any residual mismatches between the oscillator replica circuit 620 and the final stage of the CO 610. For example, the residual mismatches may be minimized by a coarse calibration loop and a fine calibration loop.

In one example, the CO 610 produces a first differential output signal from the fourth stage 614 as the inphase clock output signal 615 (labeled as CLK) which may include the plus inphase output 615a and the minus inphase output 615b. For example, the CO 610 produces a second differential output signal from the second stage 612 as a quadrature clock output signal QCLK (not labeled). In one example, the quadrature clock output signal QCLK may include a plus quadrature output 616a and a minus quadrature output 616b, as shown in FIG. 6. In one example, the quadrature clock output signal QCLK has a 90-degree phase offset relative to the inphase clock output signal 615 (labeled as CLK).

In one example, the CO 610 may be configured as an injection-locked clock oscillator. For example, the injected clock signal 631 (labeled as CLOCK_Inj) may be inputted into the pulse generator 630 to produce a pulse output signal 634. The pulse generator 630 may include a variable delay element 632 and an XOR circuit 633. The components of the pulse generator 630 is described herein as an example. One skilled in the art would understand that other components may be used to implement a pulse generator.

In one example, the pulse output signal 634 is an input to the fourth stage 614 of the CO 610. For example, the pulse generator 630 may include the XOR circuit 633 with a first XOR input connected to the injected clock signal 631 (labeled as CLOCK_Inj) and a second XOR input connected to an output of the variable delay element 632. In one example, the variable delay element 632 supplies a time-delayed version of the injected clock signal 631 (labeled as CLOCK_Inj). In one example, the pulse output signal 634 has a period synchronous with transitions of the injected clock signal 631 (labeled as CLOCK_Inj). The pulse output signal 634 may reset a phase of the inphase clock output signal 615 (labeled as CLK). For example, the CO 610 may operate in a free running mode (i.e., without clock injection) or in an injection mode (i.e., with clock injection active).

In one example, the CO 610 produces a third differential output signal (not labeled) of the CO 610 from the third stage 613. In one example, the third differential output signal includes two components: a plus replica input 617a and a minus replica input 617b as shown in FIG. 6. Both the plus replica input 617a and a minus replica input 617b serve as input signals to the oscillator replica circuit 620. The output of the oscillator replica circuit 620 is the replica clock signal 625 (labeled as CLK_REP) which includes the plus replica output 625a and the minus replica output 625b.

FIG. 6 also shows the digital calibration circuit 640 with the coarse calibration circuit 645 and the fine calibration circuit 650. The digital calibration circuit 640 may be used to compensate for frequency offsets or frequency drifts in the CO 610. In one example, a frequency offset is a static frequency difference between two oscillators and a frequency drift is a dynamic frequency difference between two oscillators. In one example, the coarse calibration circuit 645 includes a coarse digital to analog converter (DAC) to apply a coarse calibration signal 646 to a control signal 660. In one example, the fine calibration circuit 650 includes a fine digital to analog converter (DAC) to apply a fine calibration signal 651 to the control signal 660. For example, the coarse calibration signal 646 and the fine calibration signal 651 may be applied at different times. In one example, the control signal 660 may be a voltage control signal to the CO 610 or may be a current control signal to the CO 610.

In one example, the inphase clock output signal 615 (labeled as CLK) from the CO 610 and the replica clock signal CLK_REP 625 from the oscillator replica circuit 620 may be phase aligned (i.e., the phase difference PHI is zero) during free running mode, if there are no mismatches between the oscillator replica circuit 620 and the final stage 614 of the CO 610. In one example, the inphase clock output signal CLK 615 from the CO 610 and the replica clock signal CLK_REP 625 from the oscillator replica circuit 620 may be phase misaligned (i.e., the phase difference PHI is non-zero) during injection mode. For example, the phase difference PHI may vary as the inphase clock output signal 615 (labeled as CLK) from the CO 610 and the replica clock signal CLK_REP 625 have different nominal frequencies. In one example, a nominal frequency is an average frequency (i.e., rate of change of phase vs. time) over an averaging time interval.

In one example, the oscillator replica circuit 620 is calibrated to compensate for any mismatches relative to the fourth stage 614 (i.e., the final stage) of the CO 610. For example, the digital calibration circuit 640 may be used to compensate any mismatches between the fourth stage 614 (i.e., the final stage) of the CO 610 and the oscillator replica circuit 620. In one example, the digital calibration circuit 640 may operate in a closed loop mode using the phase difference PHI as a feedback input to the digital calibration circuit 640.

Figure 7:
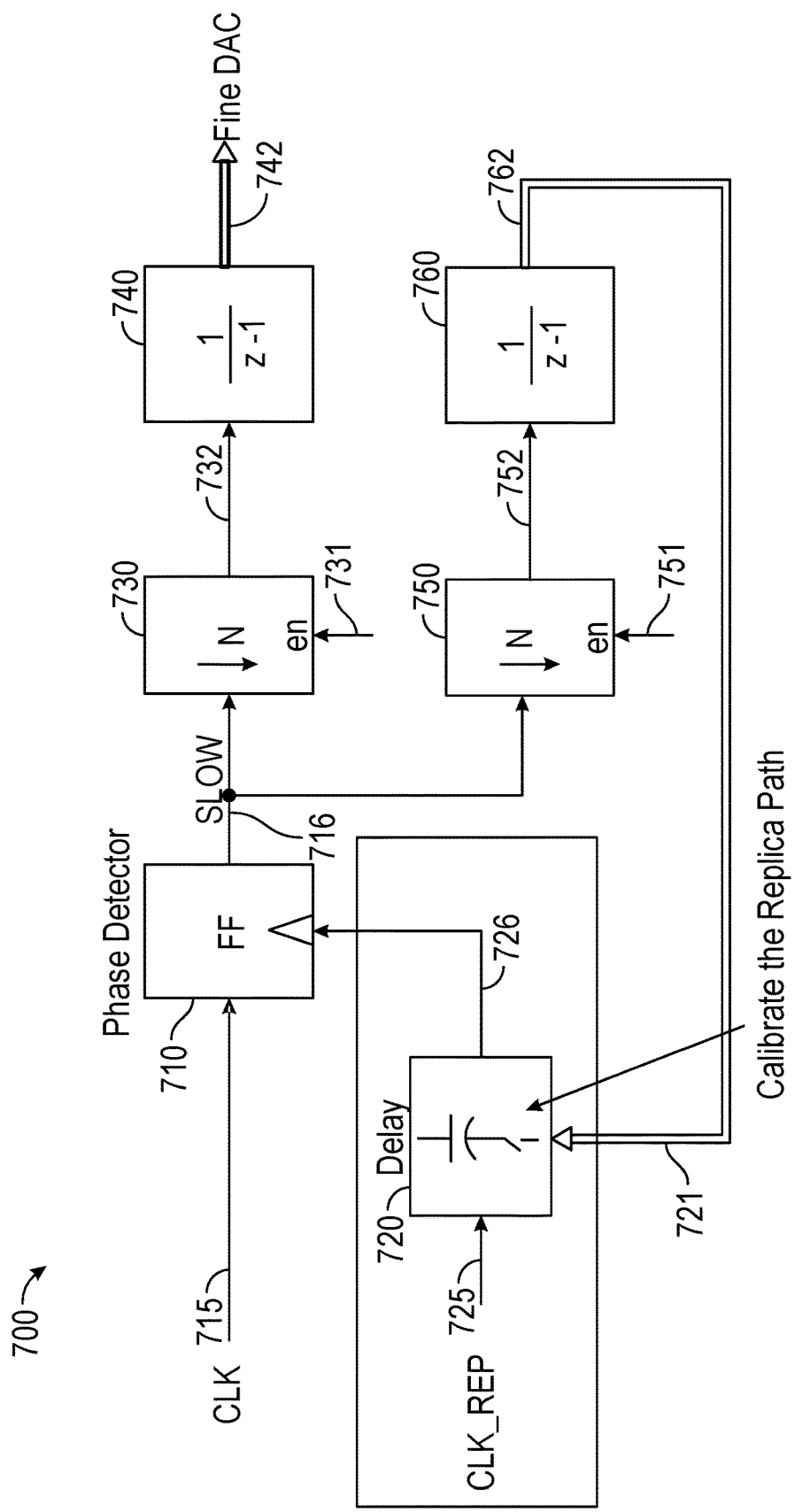
FIG. 7 illustrates an example of a fine calibration circuit as part of a digital calibration circuit.

FIG. 7 illustrates an example of a fine calibration circuit 700 as part of a digital calibration circuit. In one example, the fine calibration circuit 700 includes a phase detector 710, a delay module 720, a first decimator 730, a first accumulator 740, a second decimator 750 and a second accumulator 760.

In one example, the phase detector 710 accepts a clock signal CLK 715 as a signal input 711 and a strobe signal 726 as a trigger signal. In one example, the clock signal CLK 715 is the inphase clock output signal 615 (labeled as CLK) of FIG. 6. In one example, the phase detector 710 may be a bang-bang phase detector. The phase detector 710 produces a phase detector output 716. In one example, when the trigger signal changes state (e.g. from a low state to a high state, or from a high state to a low state), the phase detector output 716 tracks a phase difference between a clock signal 715 (labeled as CLK) and a replica clock signal 725 (labeled as CLK_REP).

In one example, a delay module 720 in the fine calibration circuit 700 generates the strobe signal 726 from a replica clock signal 725 (labeled as CLK_REP) at its input. In one example, the replica clock signal 725 (labeled as CLK_REP) is the same as the replica clock signal CLK_REP 625 of FIG. 6. For example, the strobe signal 726 is generated as a delayed version of the replica clock signal 725 with a variable time delay controlled by a feedback signal 721. For example, the variable time delay may be proportional to the feedback signal.

In one example, the phase detector output 716 may be sent to the first decimator 730 to produce a first decimator output 732. In one example, a decimator reduces a sample rate of a signal. For example, a N:1 decimator reduces the sample rate by a factor of N. In one example, the first decimator 730 is enabled by a first enable signal 731. Next, the first decimator output 732 may be sent to the first accumulator 740 to produce a first accumulator output 742. In one example, the accumulator adds samples of an input signal to produce an accumulator output. In one example, the first accumulator output 742 serves as an input to a fine DAC.

In one example, the phase detector output 716 may be sent to the second decimator 750 to produce a second decimator output 752. In one example, the second decimator 750 is enabled by a second enable signal 751. Next, the second decimator output 752 may be sent to the second accumulator 760 to produce a second accumulator output 762. In one example, the second decimator output 752 represents an average of a phase difference between the clock signal 715 (labeled as CLK) and the replica clock signal 725 (labeled as CLK_REP). In one example, the second accumulator output 762 serves as the feedback signal 721 for the delay module 720.

In one example, the feedback signal 721 controls the variable time delay of the delay module 720. The feedback signal 721 may be used to calibrate the replica clock signal 725. For example, the strobe signal 726 (which is an output of the delay module 720) is a delayed version of the replica clock signal 725.

Figure 8:
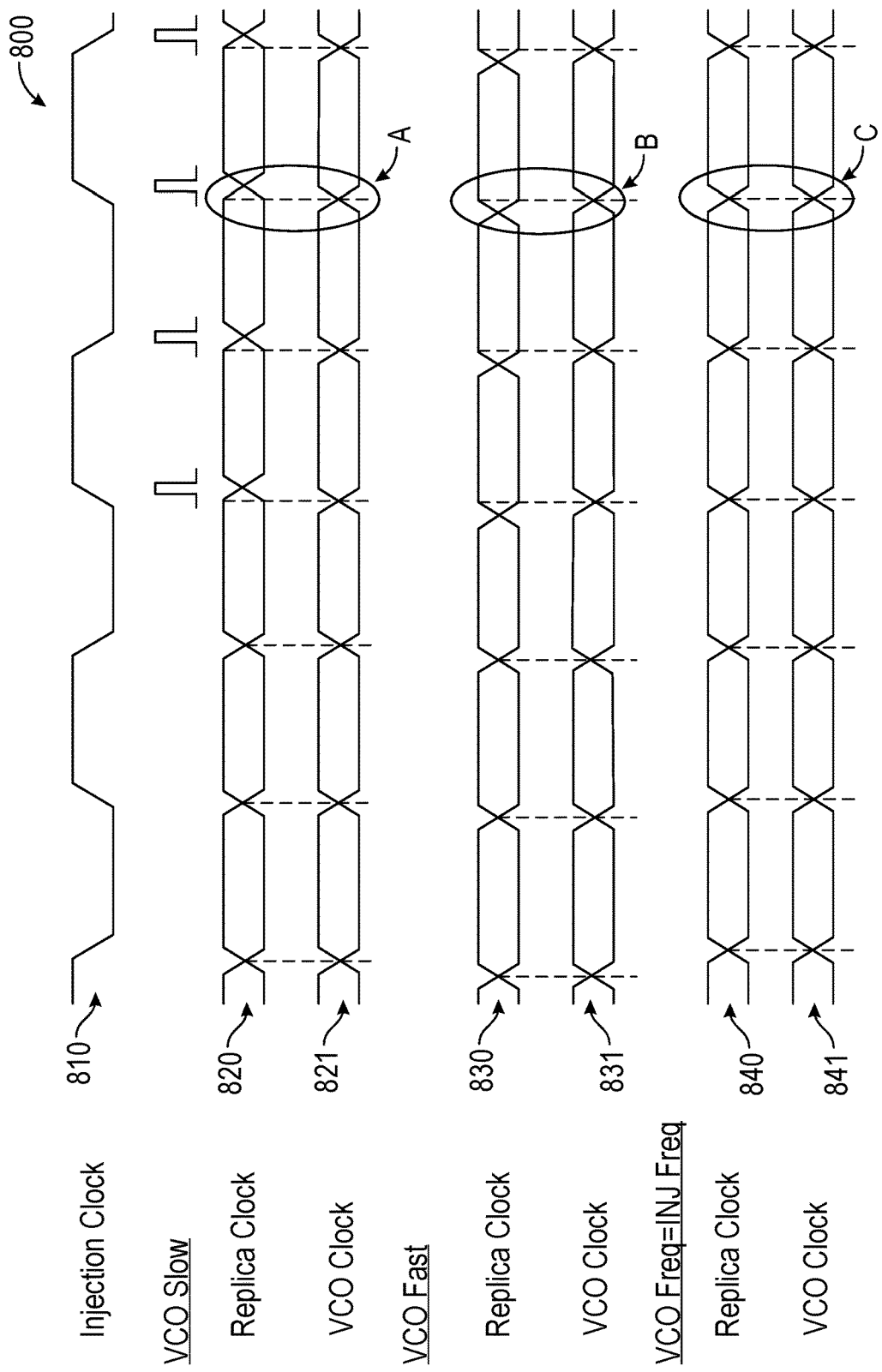
FIG. 8 illustrates an example chart showing clock signals for an injection-locked clock generator with digital calibration.

FIG. 8 illustrates an example chart 800 showing clock signals for an injection-locked clock generator with digital calibration. The horizontal axis of the chart 800 is in the unit of time. The vertical axes represent various clock signals. For example, an injected clock signal 810 is shown at the top. In one example, the injected clock signal is a periodic signal with a period T. Period is defined as time interval between edge transitions of the same polarity. Also shown are a replica clock signal 820 (labeled as REPLICA CLOCK) and an inphase clock output signal 821 (labeled as VCO CLOCK) with the inphase clock output signal 821 leading the replica clock signal 820 as indicated by the oval marked as A.

Also shown are the replica clock signal 830 (labeled as REPLICA CLOCK) and the inphase clock output signal 831 (labeled as VCO CLOCK) with the inphase clock output signal 831 lagging the replica clock signal 830 as indicated by the oval marked as B. Also shown are the replica clock signal 840 (labeled as REPLICA CLOCK) and the inphase clock output signal 841 (labeled as VCO CLOCK) with the inphase clock output signal 841 aligning the replica clock signal 840 as indicated by the oval marked as C.

In one example, the inphase clock output signal 821, 831, 841 serves as a frequency reference signal aligned with a target frequency for a controlled oscillator. And, in one example, the replica clock signal 820, 830, 840 represents a voltage controlled oscillator (VCO). For example, if the inphase clock output signal 821 leads the replica clock signal 820, we may label this example as "VCO SLOW". For example, if the inphase clock output signal 831 lags the replica clock signal 830, we may label this example as "VCO FAST". For example, if the inphase clock output signal 841 aligns with the replica clock signal 840, we may label this example as "VCO Freq=INJ Freq".

Figure 9:
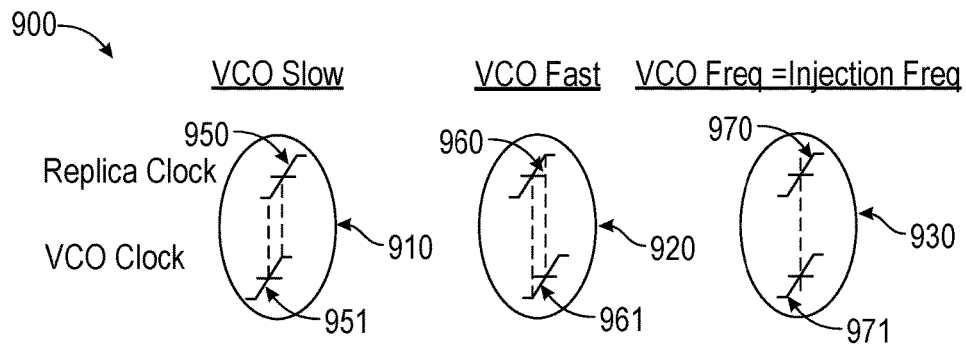
FIG. 9 illustrates an example comparison of inphase clock signal and replica clock signal for three scenarios.

FIG. 9 illustrates an example comparison 900 of inphase clock signal and replica clock signal for three scenarios. In a first scenario 910, an inphase clock signal 951 leads a replica clock signal 950. In a second scenario 920, the inphase clock signal 961 lags the replica clock signal 960. In a third scenario 930, the inphase clock signal 971 aligns the replica clock signal 970.

Figure 10:
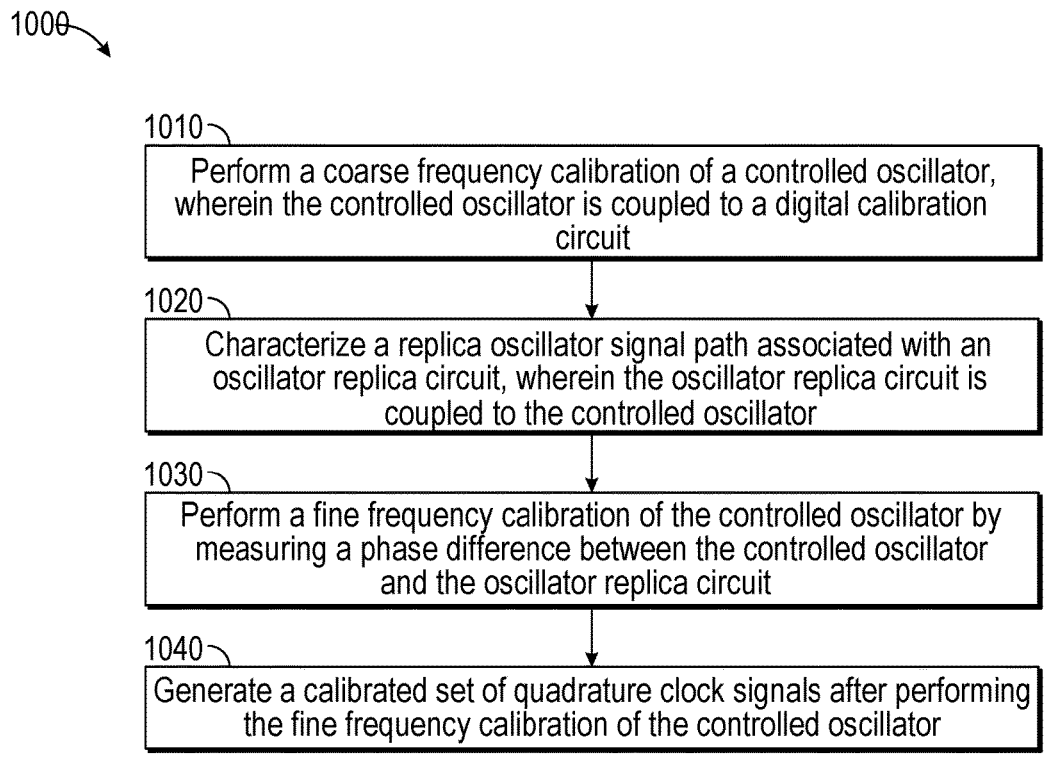
FIG. 10 illustrates an example flow diagram for quadrature clock generation with injection locking using a digital calibration circuit with a coarse calibration circuit and a fine calibration circuit.

FIG. 10 illustrates an example flow diagram 1000 for quadrature clock generation with injection locking using a digital calibration circuit with a coarse calibration circuit and a fine calibration circuit. In block 1010, perform a coarse frequency calibration of a controlled oscillator, wherein the controlled oscillator is coupled to a digital calibration circuit. In one example, the coarse frequency calibration uses a coarse calibration signal generated by a coarse calibration circuit. In one example, the coarse calibration circuit is the same as the coarse calibration circuit 645 shown in FIG. 6.

In one example, the coarse calibration circuit associated with the digital calibration circuit performs the coarse frequency calibration.

In one example, the coarse calibration signal is generated in an open loop mode. In one example, the coarse calibration signal is generated without an injection signal present in the controlled oscillator. In one example, the controlled oscillator is the controlled oscillator (CO) 610 shown in FIG. 6.

In one example, the coarse calibration circuit includes a coarse digital to analog converter (DAC) to generate the coarse calibration signal. In one example, the coarse frequency calibration drives a frequency of the controlled oscillator toward a target frequency. In one example, the target frequency is set to a nominal frequency of the controlled oscillator.

In block 1020, characterize a replica oscillator signal path associated with an oscillator replica circuit, wherein the oscillator replica circuit is coupled to the controlled oscillator. In one example, the characterization in performed without an injection signal present in the controlled oscillator. In one example, the characterization of the replica oscillator signal path is performed using a variable time delay. In one example, the variable time delay is controlled by a feedback signal. In one example, the feedback signal is an average of a phase difference between two clock signals (e.g., an inphase clock output signal 615 (labeled as CLK) and replica clock signal 625 (labeled as CLK_REP)). In one example, the replica oscillator signal path includes an oscillator replica circuit. The oscillator replica circuit may be matched to a final stage of the controlled oscillator (e.g., the fourth state 614 of the controlled oscillator (CO) 610). That is, in one example, the oscillator replica circuit is closely matched in terms of circuit construction to the final stage of the controlled oscillator. In one example, the oscillator replica circuit is self-characterizing. That is, the oscillator replica circuit characterizes the replica oscillator signal path. In another example, a processor (not shown) coupled to or part of the injection-locked clock generator 600 characterizes the replica oscillator signal path.

In one example, characterizing the replica oscillator signal path includes measuring the replica oscillator signal path amplitude response and/or phase response. For example, characterizing the replica oscillator signal path amplitude response may involve measuring and logging an amplitude transfer function vs. frequency from an input of the replica oscillator signal path to an output of the replica oscillator signal path. For example, characterizing the replica oscillator signal path phase response may involve measuring and logging a phase transfer function vs. frequency or a time delay from an input of the replica oscillator signal path to an output of the replica oscillator signal path. For example, the characterization of the replica oscillator signal path may be used in subsequent blocks.

In block 1030, perform a fine frequency calibration of the controlled oscillator by measuring a phase difference between the controlled oscillator and the oscillator replica circuit. In one example, the fine frequency calibration of the controlled oscillator is performed in a closed loop mode. In one example, the phase difference is used as a feedback to achieve the closed loop mode. For example, a digital calibration circuit (e.g., the digital calibration circuit 640 shown in FIG. 6) may operate in a closed loop mode by using the phase difference as a feedback input to itself.

In one example, the fine frequency calibration uses a fine calibration signal (e.g., the fine calibration signal 651 shown in FIG. 6) generated by a fine calibration circuit (e.g., the fine calibration circuit 650 shown in FIG. 6). In one example, the fine calibration signal is generated in a closed loop mode. In one example, the fine calibration signal is generated with an injection signal present in the controlled oscillator. In one example, the fine calibration circuit uses a fine digital to analog converter (DAC) to generate the fine calibration signal. In one example, the injection signal is the same as the injected clock signal 631 (labeled as CLOCK_Inj) shown in FIG. 6. In one example, a digital calibration circuit (e.g., the digital calibration circuit 640) performs the fine frequency calibration. In one example, the digital calibration circuit may include a coarse calibration circuit and a fine calibration circuit and the fine calibration circuit (e.g., a fine calibration circuit 650) performs the fine frequency calibration.

In block 1040, generate a calibrated set of quadrature clock signals after performing the fine frequency calibration of the controlled oscillator. In one example, the calibrated set of quadrature clock signals include an inphase clock signal and a quadrature clock signal. In one example, the calibrated set of quadrature clock signals are calibrated for a frequency offset (e.g., static offset). In one example, the calibrated set of quadrature clock signals are calibrated for a frequency draft (e.g., dynamic offset). In one example, the phase difference is based on one or more of the followings: frequency offset and frequency drift. In one example, a controlled oscillator (e.g., controlled oscillator (CO) 610) generates the calibrated set of quadrature clock signals.

Figure 11:
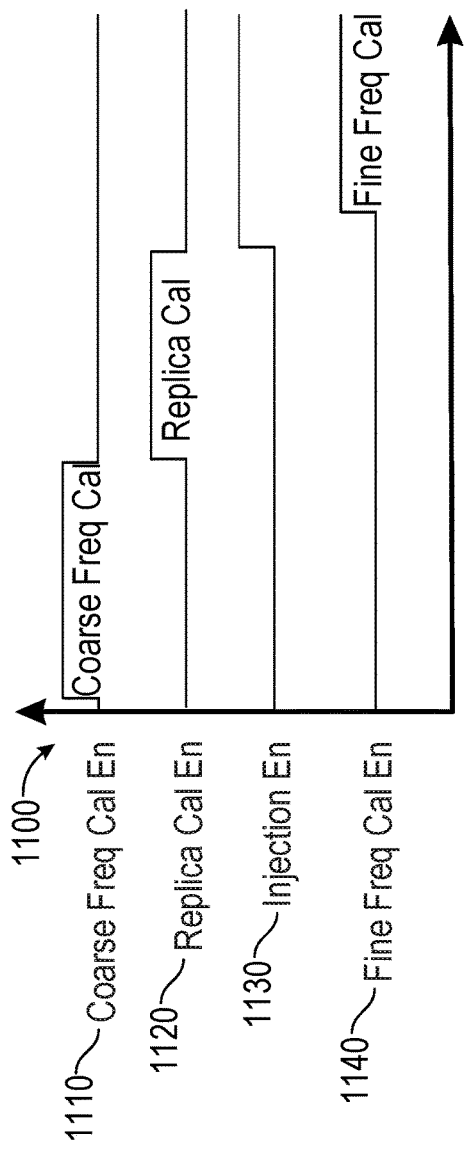
FIG. 11 illustrates an example graph of signals for a digital calibration circuit versus time.

FIG. 11 illustrates an example graph 1100 of signals for a digital calibration circuit versus time. The horizontal axis of the example graph 1100 is in unit of time. The vertical axes relate to the progression of signals for a digital calibration circuit. For example, a coarse frequency calibration enable signal 1110 (labeled as COARSE FREQ CAL EN) initiates a coarse frequency calibration when the coarse frequency calibration enable signal 1110 transitions to a HIGH state. For example, the coarse frequency calibration is terminated when the coarse frequency calibration enable signal 1110 transitions to a LOW state.

In one example, a replica calibration enable signal 1120 (labeled as REPLICA CAL EN) initiates a replica oscillator signal path characterization when the replica calibration enable signal 1120 transitions to a HIGH state. In one example, the replica calibration enable signal 1120 transitions to the HIGH state after the coarse frequency calibration enable signal 1110 transitions to a LOW state. For example, the replica oscillator signal path characterization is terminated when the replica calibration enable signal 1120 transitions to a LOW state.

In one example, an injection enable signal 1130 (labeled as INJECTION EN) initiates an injection signal when the injection enable signal 1130 transitions to a HIGH state. In one example, the injection enable signal 1130 transitions to the HIGH state after the replica calibration enable signal 1120 transitions to the LOW state.

For example, a fine frequency calibration enable signal 1140 (labeled as FINE FREQ CAL EN) initiates a fine frequency calibration when the fine frequency calibration enable signal 1140 transitions to the HIGH state. In one example, the fine frequency calibration enable signal 1140 transitions to the HIGH state after the injection enable signal 1130 transitions to the HIGH state.

Figure 12:
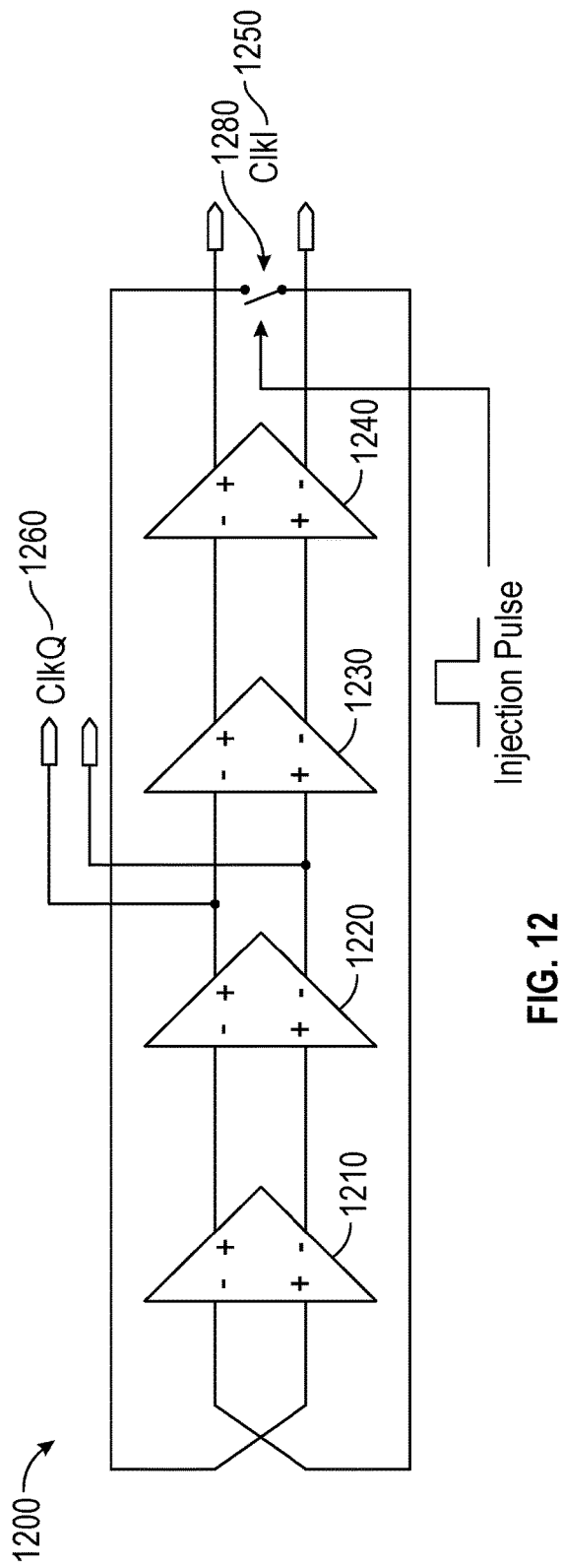
FIG. 12 illustrates an example of an injection locked ring oscillator.

FIG. 12 illustrates an example of an injection locked ring oscillator 1200. In one example, the injection locked ring oscillator 1200 includes a plurality of inverters: a first inverter 1210, a second inverter 1220, a third inverter 1230, and a fourth inverter 1240. For example, the injection locked ring oscillator 1200 may be used as a quadrature clock oscillator with two outputs: an inphase clock signal 1250 (labeled as ClkQ) and a quadrature clock signal 1260 (labeled as ClkQ). In one example, the inphase clock signal 1250 (labeled as ClkQ) is an output of the fourth inverter 1240 and the quadrature clock signal 1260 (labeled as ClkQ) is an output of the second inverter. For example, a phase of the inphase clock signal 1250 (labeled as ClkI) and a phase of the quadrature clock signal 1260 (labeled as ClkQ) are nominally orthogonal (i.e., approximately 90 degrees offset in phase).

In one example, the phase of a clock is a transition between two output states (e.g., HIGH, LOW). In one example, the inphase clock signal 1250 (labeled as ClkI) and the quadrature clock signal 1260 (labeled as ClkQ) are generated in a free running mode (i.e., in an open loop mode). In one example, the inphase clock signal 1250 (labeled as ClkQ) and the quadrature clock signal 1260 (labeled as ClkQ) are generated in a closed loop mode where an injection pulse signal 1270 is applied to a switch 1280 in a closed position. For example, the injection pulse signal 1270 resets the phase of the inphase clock signal 1250 (labeled as ClkQ) and the phase of the quadrature signal 1260 (labeled as ClkQ).

Figure 13:
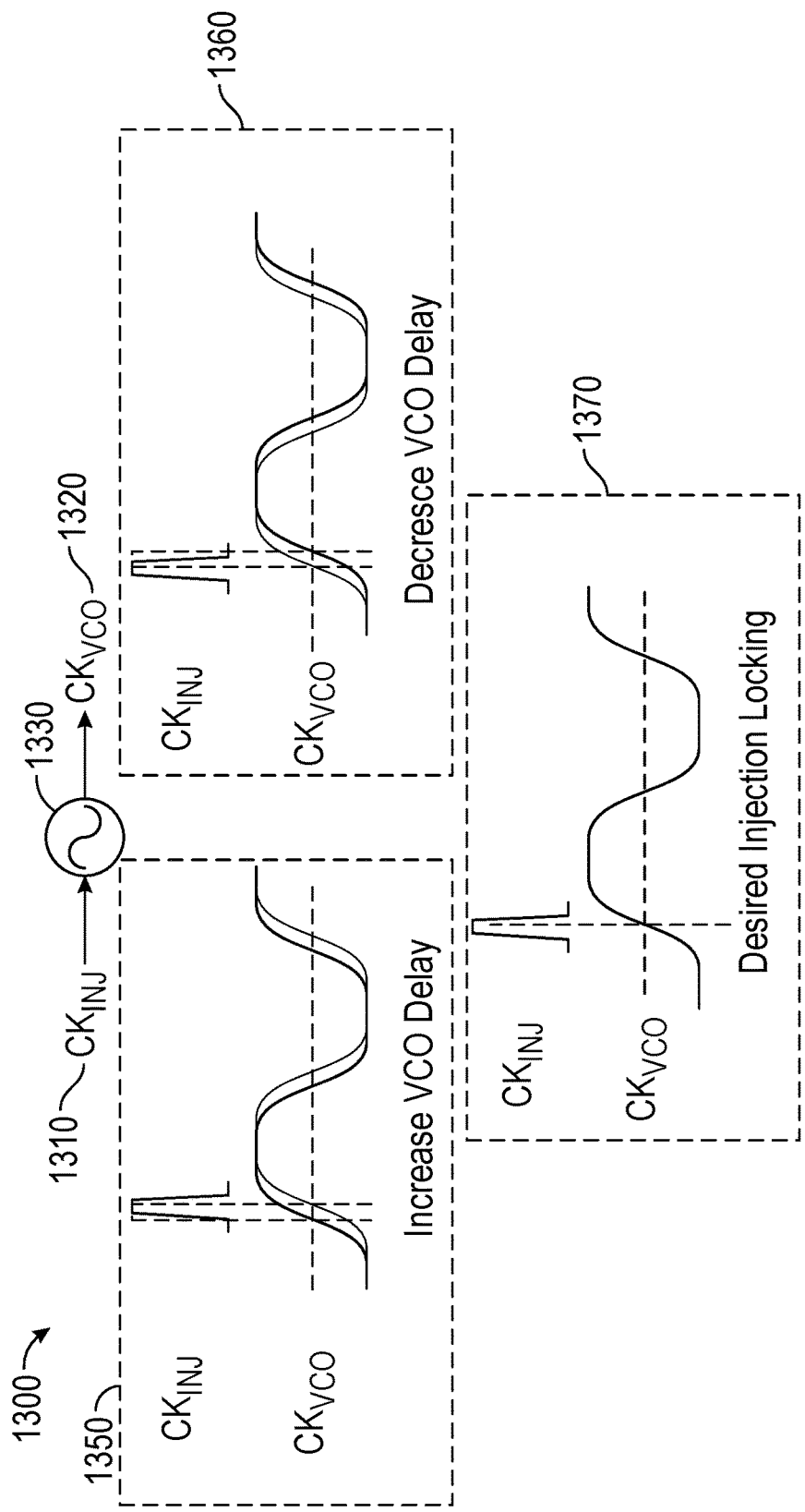
FIG. 13 illustrates an example graph of various clock waveform scenarios for an injection locked ring oscillator.

FIG. 13 illustrates an example graph 1300 of various clock waveform scenarios for an injection locked ring oscillator. For example, an injection signal 1310 (labeled as $CK_{INJ}$) serves as an oscillator input signal to injected locked ring oscillator 1330 which produces an oscillator output signal 1320 (labeled as $CK_{VCO}$).

In a first scenario 1350, the injection signal injection signal (labeled as $CK_{INJ}$) is injected to oscillator 1330 to increase a time delay of the oscillator output signal (labeled as $CK_{VCO}$) relative to a replica clock signal. In a second scenario 1360, the injection signal (labeled as $CK_{INJ}$) is injected to oscillator 1330 to decrease a time delay of the oscillator output signal (labeled as $CK_{VCO}$) relative to the replica clock signal. In a third scenario 1370, the injection signal (labeled as $CK_{INJ}$) is injected to oscillator 1330 to match a time delay of the oscillator output signal (labeled as $CK_{VCO}$) relative to the replica clock signal. In one example, the third scenario 1370 represents a desired injection locking scenario.

In one aspect, one or more of the steps for providing for quadrature clock generation with injection locking using a digital calibration circuit with a coarse calibration circuit and a fine calibration circuit in FIG. 10 may be executed by one or more processors which may include hardware, software, firmware, etc. In one aspect, one or more of the in FIG. 10 may be executed by one or more processors which may include hardware, software, firmware, etc. The one or more processors, for example, may be used to execute software or firmware needed to perform the steps in the flow diagram of FIG. 14. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in the processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for quadrature clock generation with injection locking. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. An injection-locked clock generator comprising:
a controlled oscillator (CO) to generate a clock signal;
an oscillator replica circuit coupled to the controlled oscillator, the oscillator replica circuit to generate a replica clock signal; and
a digital calibration circuit coupled to the controlled oscillator, wherein the digital calibration circuit comprises a coarse calibration circuit and a fine calibration circuit, and wherein the fine calibration circuit performs a fine frequency calibration based on a phase difference between the clock signal and the replica clock signal.

2. The injection-locked clock generator of claim 1, further comprising a phase detector for generating the phase difference.

3. The injection-locked clock generator of claim 2, wherein the controlled oscillator comprises a plurality of cascaded stages with a final stage.

4. The injection-locked clock generator of claim 3, further comprising a pulse generator to provide an injected clock signal to the final stage.

5. The injection-locked clock generator of claim 4, wherein the controlled oscillator generates a calibrated set of quadrature clock signals after the fine calibration circuit performs the fine frequency calibration.

6. The injection-locked clock generator of claim 1, wherein the coarse calibration circuit generates a coarse calibration signal.

7. The injection-locked clock generator of claim 6, wherein the coarse calibration circuit comprises a coarse digital to analog converter (DAC), and wherein the coarse digital to analog converter (DAC) generates the coarse calibration signal.

8. A method for quadrature clock generation with injection locking using a digital calibration circuit having a coarse calibration circuit and a fine calibration circuit comprising:
performing a coarse frequency calibration of a controlled oscillator, wherein the controlled oscillator is coupled to the digital calibration circuit;
characterizing a replica oscillator signal path associated with an oscillator replica circuit, wherein the oscillator replica circuit is coupled to the controlled oscillator;
performing a fine frequency calibration of the controlled oscillator by measuring a phase difference between the controlled oscillator and the oscillator replica circuit; and
generating a calibrated set of quadrature clock signals after performing the fine frequency calibration of the controlled oscillator.

9. The method of claim 8, further comprising generating a coarse calibration signal.

10. The method of claim 9, wherein the coarse calibration signal is generated by a coarse calibration circuit, and wherein the coarse calibration circuit is a component of the digital calibration circuit.

11. The method of claim 9, wherein the coarse calibration signal is generated in an open loop mode.

12. The method of claim 11, wherein the coarse calibration signal is generated without an injection signal present in the controlled oscillator.

13. The method of claim 8, further comprising using the coarse frequency calibration to drive a frequency of the controlled oscillator towards a target frequency.

14. The method of claim 8, wherein the characterizing the replica oscillator signal path is performed without an injection signal present in the controlled oscillator.

15. The method of claim 14, wherein the characterizing the replica oscillator signal path is performed using a variable time delay.

16. The method of claim 15, wherein the variable time delay is controlled by a feedback signal.

17. The method of claim 16, wherein the feedback signal is an average of a phase difference between a first clock signal and a second clock signal.

18. The method of claim 17, wherein the first clock signal is an output of the controlled oscillator and the second clock signal is an output of the oscillator replica circuit.

19. The method of claim 8, wherein the controlled oscillator comprises a plurality of cascaded stages with a final stage.

20. The method of claim 19, wherein the oscillator replica circuit is matched to the final stage.

21. The method of claim 8, wherein the fine frequency calibration is performed in a closed loop.

22. The method of claim 21, further comprising using a phase difference between a first clock signal and a second clock signal as a feedback signal to achieve the closed loop.

23. The method of claim 22, wherein the first clock signal is an output of the controlled oscillator and the second clock signal is an output of the oscillator replica circuit.

24. The method of claim 22, wherein the fine frequency calibration is performed with an injection signal present in the controlled oscillator.

25. The method of claim 24, wherein the calibrated set of quadrature clock signals comprises an inphase clock signal and a quadrature clock signal.

26. The method of claim 25, wherein the calibrated set of quadrature clock signals are calibrated for one of the following: a) a frequency offset, b) a frequency drift, or c) a frequency offset and a frequency drift.

27. The method of claim 26, wherein the phase difference is based on one or more of the following: a) the frequency offset, b) the frequency drift, or c) the frequency offset and the frequency drift.

28. An apparatus for quadrature clock generation with injection locking, the apparatus comprising:
   means for performing a coarse frequency calibration of a controlled oscillator, wherein the controlled oscillator is coupled to a digital calibration circuit;
   means for characterizing a replica oscillator signal path associated with an oscillator replica circuit, wherein the oscillator replica circuit is coupled to the controlled oscillator;
   means for performing a fine frequency calibration of the controlled oscillator by measuring a phase difference between the controlled oscillator and the oscillator replica circuit; and
   means for generating a calibrated set of quadrature clock signals after performing the fine frequency calibration of the controlled oscillator.

29. A computer-readable medium storing computer executable code, operable on a device comprising at least one processor and at least one memory coupled to the at least one processor, wherein the at least one processor is configured to implement quadrature clock generation with injection locking, the computer executable code comprising:
   instructions for causing a computer to perform a coarse frequency calibration of a controlled oscillator, wherein the controlled oscillator is coupled to a digital calibration circuit;
   instructions for causing the computer to characterize a replica oscillator signal path associated with an oscillator replica circuit, wherein the oscillator replica circuit is coupled to the controlled oscillator;
   instructions for causing the computer to perform a fine frequency calibration of the controlled oscillator by measuring a phase difference between the controlled oscillator and the oscillator replica circuit; and
   instructions for causing the computer to generate a calibrated set of quadrature clock signals after performing the fine frequency calibration of the controlled oscillator.

30. The computer-readable medium of claim 29, further comprising instructions for causing the computer to perform the fine frequency calibration with an injection signal present in the controlled oscillator.

* * * * *